United States Patent
McPherson et al.

(10) Patent No.: US 12,150,258 B2
(45) Date of Patent: Nov. 19, 2024

(54) DUAL INLINE POWER MODULE

(71) Applicant: Wolfspeed, Inc., Durham, NC (US)

(72) Inventors: Brice McPherson, Fayetteville, AR (US); Shashwat Singh, Fayetteville, AR (US); Roberto M. Schupbach, Raleigh, NC (US)

(73) Assignee: WOLFSPEED, INC., Durham, NC (US)

( * ) Notice: Subject to any disclaimer, the term of this patent is extended or adjusted under 35 U.S.C. 154(b) by 266 days.

(21) Appl. No.: 17/736,487

(22) Filed: May 4, 2022

(65) Prior Publication Data
US 2023/0363097 A1 Nov. 9, 2023

(51) Int. Cl.
| | |
|---|---|
| *H05K 1/18* | (2006.01) |
| *H05K 1/11* | (2006.01) |
| *H05K 5/00* | (2006.01) |
| *H02M 3/00* | (2006.01) |

(52) U.S. Cl.
CPC .......... *H05K 5/0069* (2013.01); *H05K 1/111* (2013.01); *H02M 3/003* (2021.05)

(58) Field of Classification Search
CPC ...... H05K 5/0069; H05K 1/111; H02M 3/003
USPC ....................................................... 361/760
See application file for complete search history.

(56) References Cited

U.S. PATENT DOCUMENTS

| | | | |
|---|---|---|---|
| 2006/0022298 A1* | 2/2006 | Shiraishi | H02M 7/003 257/E29.066 |
| 2012/0075816 A1 | 3/2012 | Mashimo et al. | |
| 2017/0110395 A1 | 4/2017 | Iwabuchi et al. | |
| 2020/0266727 A1 | 8/2020 | Tsuchimochi et al. | |
| 2020/0388580 A1 | 12/2020 | Furutani | |
| 2021/0167003 A1 | 6/2021 | Ieiri et al. | |
| 2021/0305166 A1 | 9/2021 | Moxey et al. | |
| 2021/0313243 A1 | 10/2021 | McPherson | |
| 2022/0102260 A1* | 3/2022 | Cole | H05K 1/147 |

FOREIGN PATENT DOCUMENTS

GB 2096394 A 10/1982

OTHER PUBLICATIONS

International Search Report and Written Opinion for Application No. PCT/US2023/019035, mailed Aug. 17, 2023, 16 pages.

* cited by examiner

*Primary Examiner* — Binh B Tran
(74) *Attorney, Agent, or Firm* — Dority & Manning. P.A.

(57) ABSTRACT

A power module is provided with a substrate, power devices, and a housing. The power devices are mounted on device pads of the substrate and arranged to provide a power circuit having a first input, a second input, and at least one output. First and second power terminals provide first and second inputs for the power circuit. At least one output power terminal provides at least one output. The housing encompasses the substrate, the power devices, and portions of the first and second input power terminals as well as the at least one output power terminal.

37 Claims, 14 Drawing Sheets

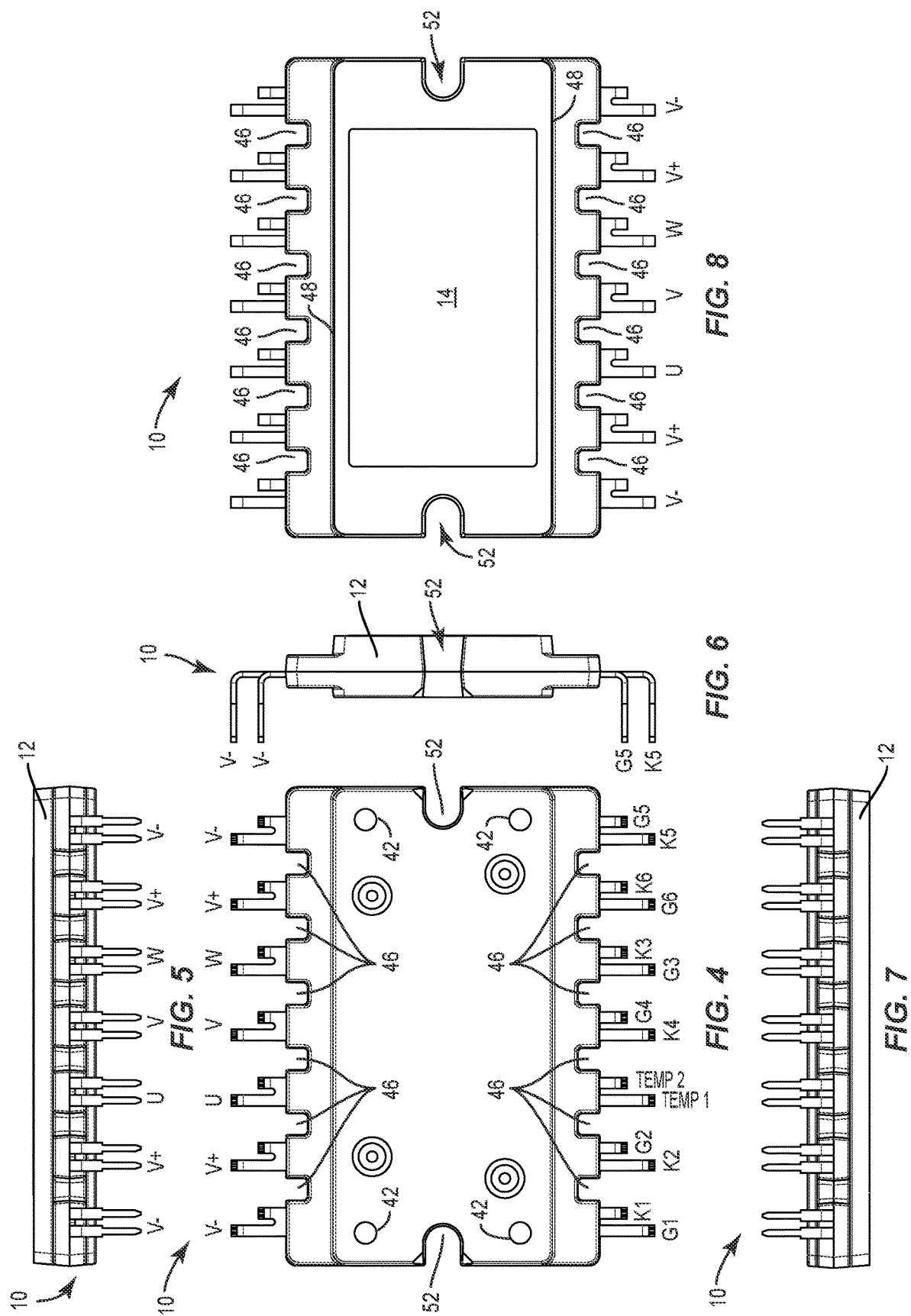

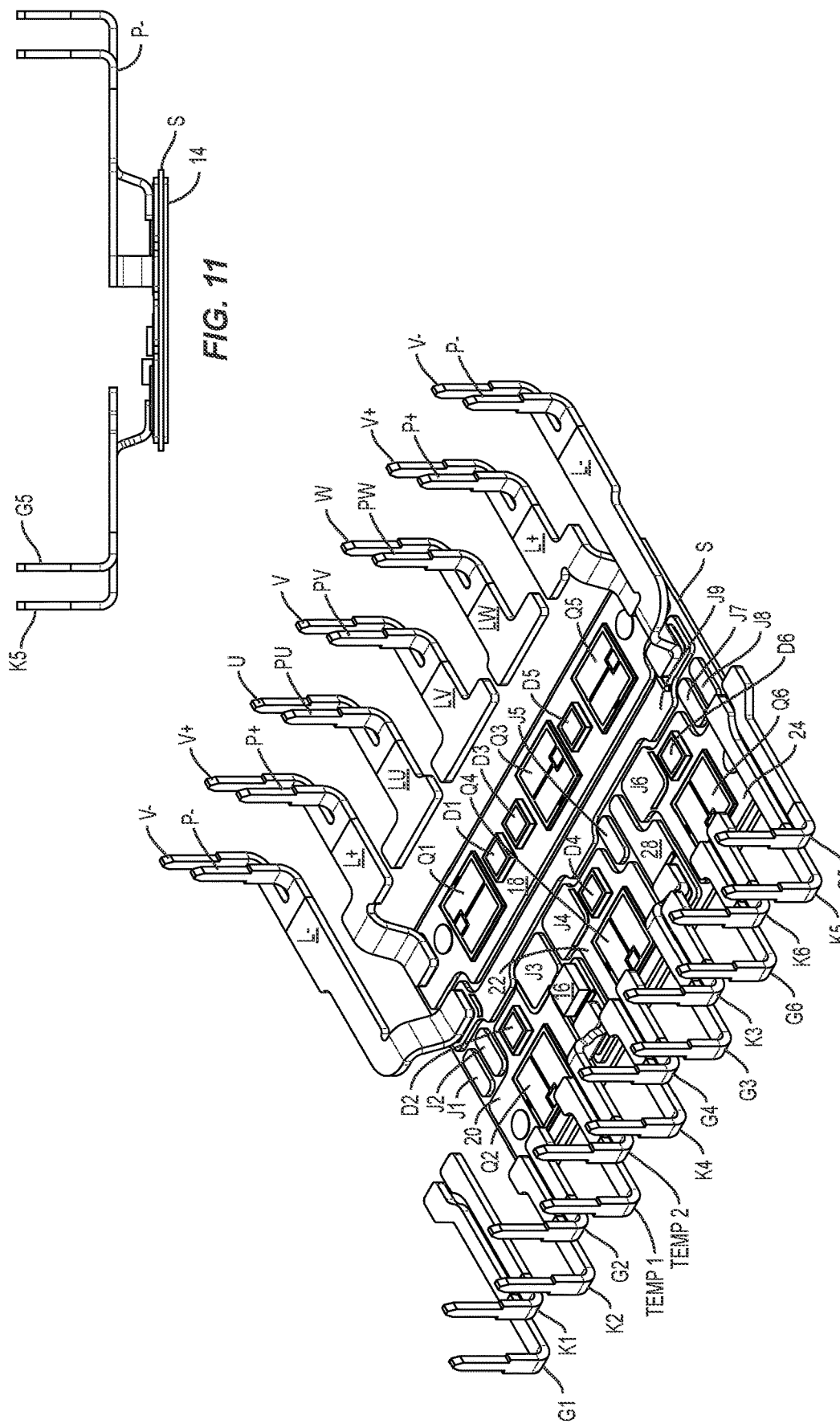

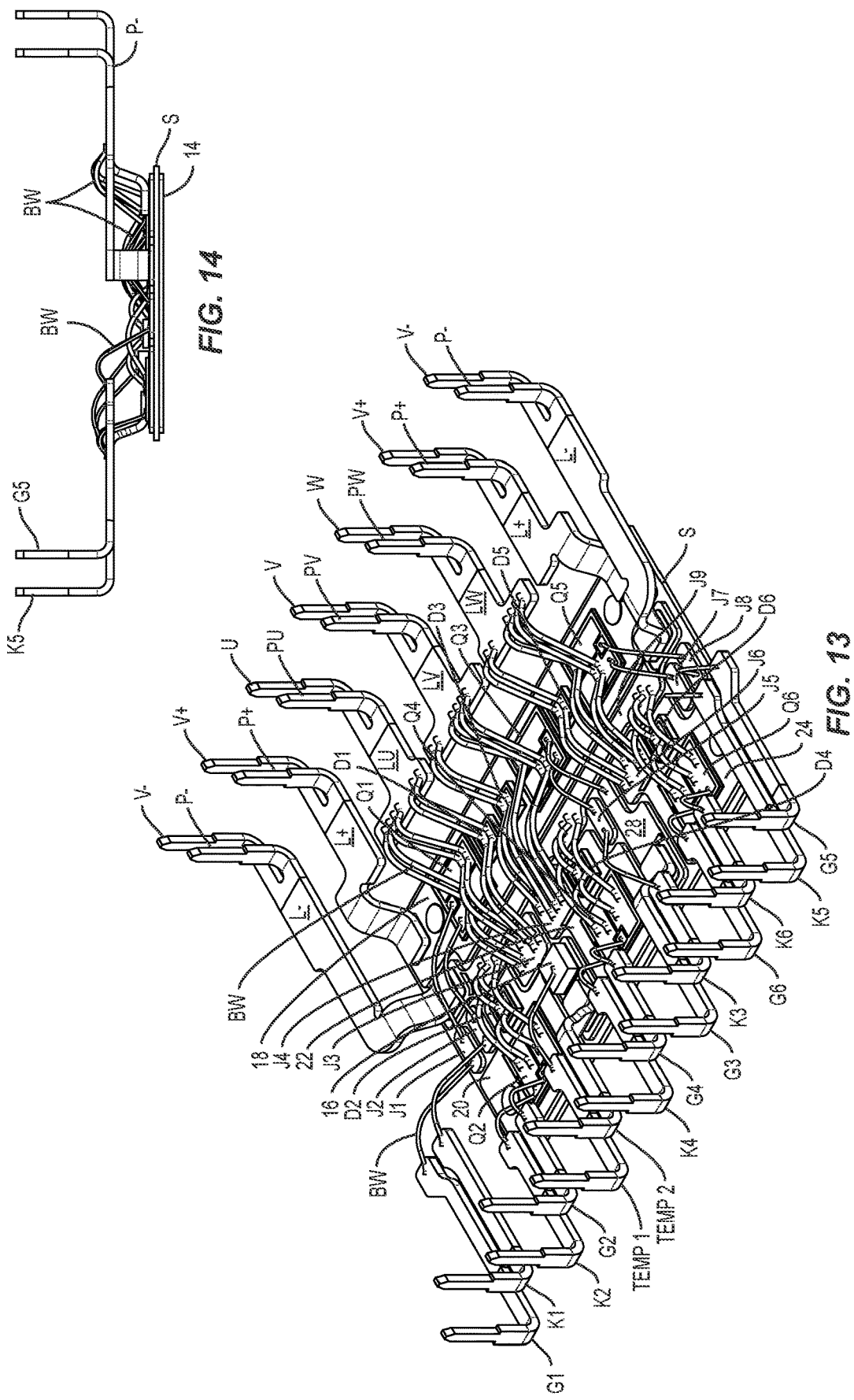

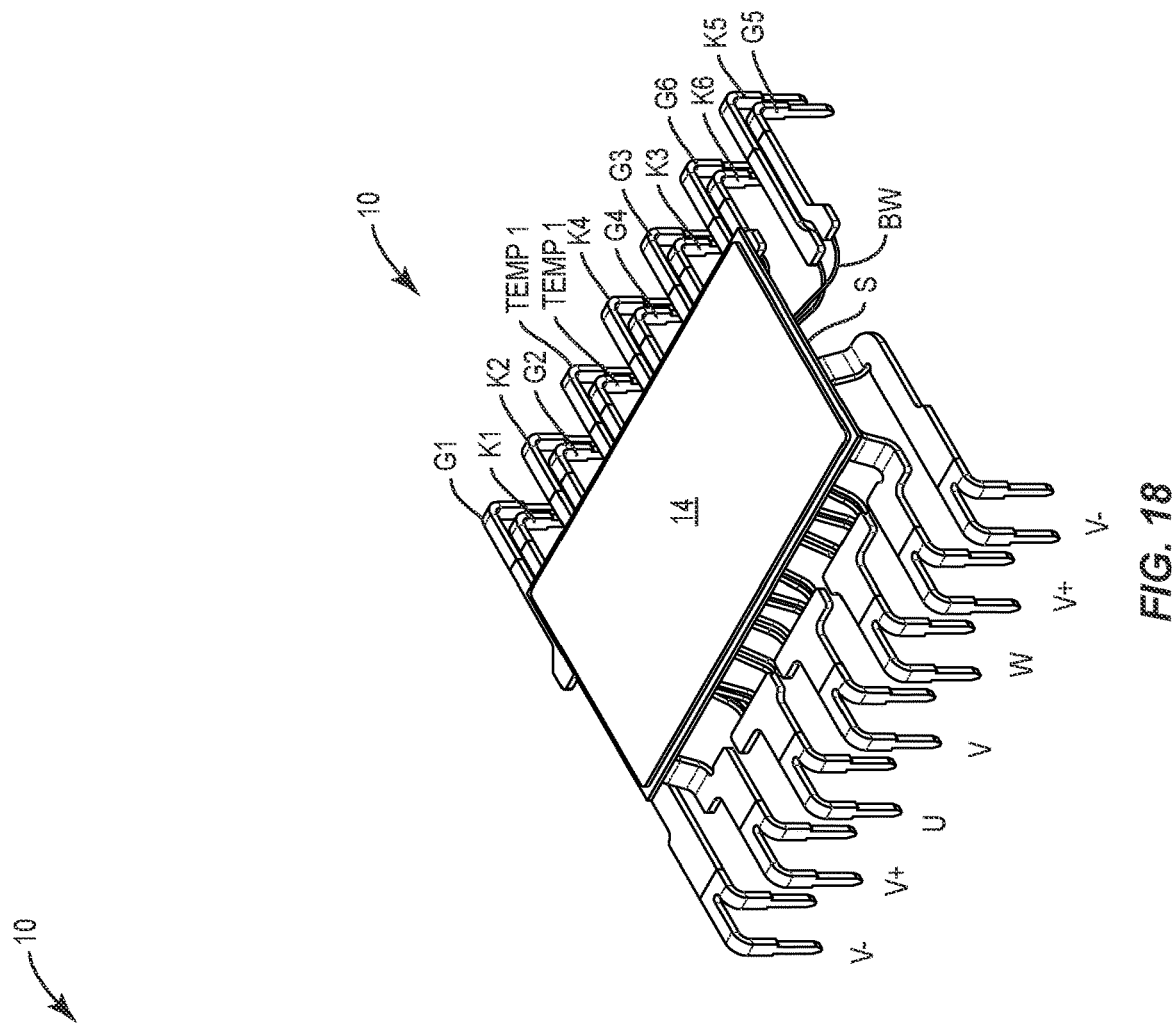
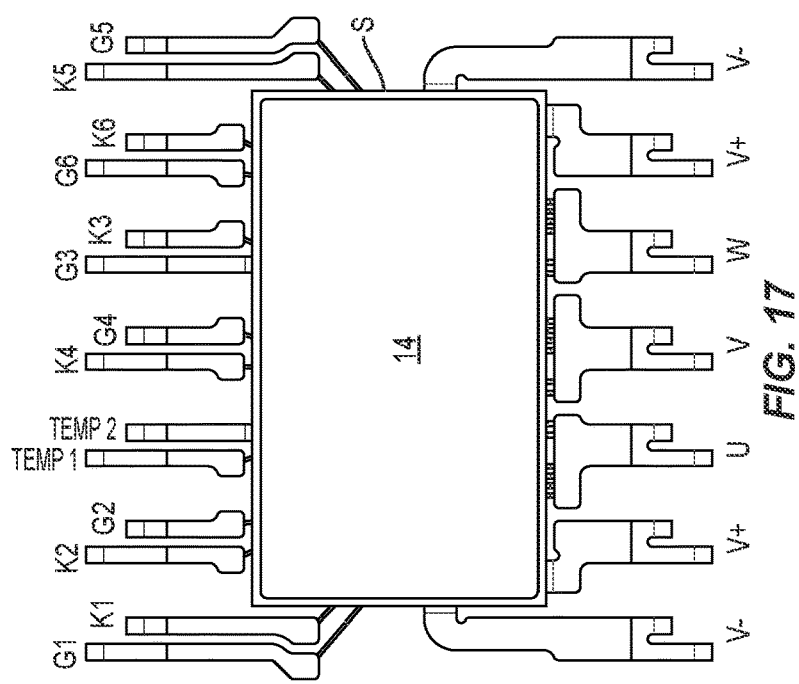

DUAL INLINE POWER MODULE

FIELD OF THE DISCLOSURE

The present disclosure relates to power modules for high power applications.

BACKGROUND OF THE DISCLOSURE

In high power applications, multiple components for all or a portion of a circuit are often packaged in electronic modules. These modules are generally referred to as power modules, and are housed in a thermoplastic, epoxy, or like molded housing that encapsulates the components and the circuit board or substrate on which the components are mounted. The input/output connections for the power module are provided by terminal assemblies that extend out of the housing to facilitate incorporation in and connection to other systems. Such systems may include electric vehicles, power conversion and control, and the like.

SUMMARY

A power module is provided with a substrate, power devices, and a housing. The power devices are mounted on device pads of the substrate and arranged to provide a power circuit having a first input, a second input, and at least one output. First and second power terminals provide first and second inputs for the power circuit. At least one output power terminal provides at least one output. The housing encompasses the substrate, the power devices, and portions of the first and second input power terminals as well as the at least one output power terminal.

In one embodiment, a housing encompasses the substrate, the plurality of power devices, and portions of the first input power terminal, second input power terminal, and the at least one output power terminal, wherein the at least one first input power terminal, the at least one second input power terminal, and the at least one output power terminal extend out of a first side of the housing. The at least one first input power terminal may provide a first V− terminal and a second V− terminal extending out of the first side of the housing. The at least one second input power terminal may provide a first V+ terminal and a second V+ terminal extending out of the first side of the housing. The first V+ terminal and the second V+ terminal may be between the first V− terminal and the second V− terminal. The at least one output power terminal may be between the first V+ terminal and the second V+ terminal.

The at least one output power terminal may provide a first output power terminal providing a first output of the power circuit, a second output power terminal providing a second output of the power circuit, and a third output power terminal providing a third output of the power circuit.

The plurality of signal terminals may provide a plurality of control signals for the power circuit, wherein portions of the plurality of signal terminals extend out of a second side of the housing that is opposite the first side of the housing. The plurality of signal terminals may include a first plurality of gate signal terminals that provide gate control signals to gates of a first set of the plurality of power devices and a second plurality of gate signal terminals that provide gate control signals to gates of a second set of the plurality of power devices.

The plurality of signal terminals may further include a first plurality of source-Kelvin signal terminals that provide source-Kelvin control signals to sources of the first set of the plurality of power devices and a second plurality of source-Kelvin signal terminals that provide source-Kelvin control signals to sources of the second set of the plurality of power devices. Each gate signal terminal of the first plurality of gate signal terminals may be adjacent a corresponding source-Kelvin signal terminal of the first plurality of source-Kelvin signal terminals, and each gate signal terminal of the second plurality of gate signal terminals may be adjacent a corresponding source-Kelvin signal terminal of the second plurality of source-Kelvin signal terminals. Additional terminals may be used for various types of sensors to monitor temperature, current, voltage, and the like.

Pin heads for adjacent pairs of the first and second plurality of gate terminals and the first and second pairs of the source-Kelvin signal terminals may be staggered apart from one another. Each of the at least one first input power terminal, the at least one second input power terminal, and the at least one output power terminal may have a first pin head and a second pin head that is staggered apart from the first pin head.

The substrate may provide at least one jumper pad, a first bond wire, and a second bond wire. The first bond wire may extend from at least one of the plurality of signal terminals to the at least one jumper pad, and the second bond wire may extend from the at least one jumper pad to the power circuit.

The at least one first input power terminal and/or the at least one second input power terminal is directly mechanically coupled to the substrate. The at least one output power terminal may not be directly mechanically coupled to the substrate, wherein bond wires couple the at least one output power terminal to the power circuit. The at least one of the plurality of signal terminals may be directly mechanically coupled to the substrate and at least one other of the plurality of signal terminals may be directly coupled to the power circuit with a bond wire, while others are not.

In select embodiments, a thermal pad is provided on a bottom side of the substrate, wherein the thermal pad is exposed through the housing. The power circuit is a three-phase circuit, full-bridge, half-bridge, or the like. A temperature circuit may be provided on the substrate.

Notches may be recessed into one or more sides of the housing for attaching the power module to another apparatus. Creepage extenders may be provided on at least one of the top side and the bottom side of the housing. One or more notches may be provided in the first side of the housing between adjacent ones of the at least one first input power terminal, the at least one second input power terminal, or the at least one output power terminal to reduce creepage.

In one embodiment, a power module is provided with a substrate, power devices, and a housing. The power devices are mounted on device pads of the substrate and arranged to provide a power circuit having a first input, a second input, and at least one output. First and second power terminals provide first and second inputs for the power circuit. At least one output power terminal provides at least one output. The housing encompasses the substrate, the power devices, and portions of the first and second input power terminals as well as the at least one output power terminal, wherein at least one of the at least one first input power terminal and/or the at least one second input power terminal is directly mechanically coupled to the substrate. At least one first input power terminal and the at least one second input power terminal are directly mechanically coupled to the substrate.

The at least one of the plurality of signal terminals may also be directly mechanically coupled to the substrate and at least one other of the plurality of signal terminals is coupled to the power circuit with a bond wire.

Based on the above, the present disclosure relates to a compact, high voltage, high current, low inductance power module designed for the next generation of silicon carbide (SiC) and other material system power devices and power electronics applications. It utilizes a novel layout incorporating a size- and cost-optimized power substrate.

A feature of this design is scalability and modularity. The layout can widen and lengthen to either (1) accommodate larger devices or (2) place more devices in parallel. Essentially, the package concept can scale up or scale down to meet the power processing needs without forfeiting any of the performance benefits that the package offers. It is also straightforward to arrange these packages in parallel, increasing the current of a converter and/or forming topologies such as half- and full-bridges (often used in DC-DC power conversion) as well as three-phase circuits (used in motor drives and inverters).

Those skilled in the art will appreciate the scope of the present disclosure and realize additional aspects thereof after reading the following detailed description in association with the accompanying drawings.

BRIEF DESCRIPTION OF THE DRAWINGS

The accompanying drawing figures incorporated in and forming a part of this specification illustrate several aspects of the disclosure, and together with the description serve to explain the principles of the disclosure.

FIG. 4 is a top plan view of the power module according to the first embodiment of the disclosure.

FIGS. 5, 6, and 7 are corresponding side views of the power module according to the first embodiment of the disclosure.

FIG. 8 is a bottom plan view of the power module according to the first embodiment of the disclosure.

FIGS. 9, 10, and 11 are top plan, top isometric, and side plan views of the power module without a housing or bond wires according to the first embodiment of the disclosure.

FIGS. 12, 13, and 14 are top plan, top isometric, and side plan views of the power module without a housing and with bond wires according to the first embodiment of the disclosure.

FIGS. 17 and 18 are bottom plan and bottom isometric views of the power module without a housing according to the first embodiment of the disclosure.

DETAILED DESCRIPTION

Figure 1B:
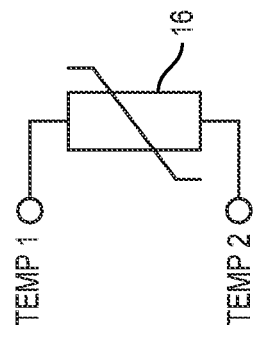
FIG. 1B Illustrates a temperature circuit.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to power modules that are used in high power applications. Power modules may contain one or more power semiconductor devices, such as metal oxide semiconductor field effect transistors (MOSFETs), insulated gate bipolar transistors (IGBTs), diodes, and the like, arranged into a variety of circuit topologies. Typical circuit topologies include, but are not limited to, a single switch, a half H-bridge circuit, a full H-bridge circuit, and a three-phase switching circuit, which is often referred to as a six-pack.

For the following discussion, a three-phase circuit is used to facilitate an understanding of the packaging concepts disclosed herein. An exemplary three-phase circuit is illustrated in FIG. 1A, according to one embodiment of the disclosure. Those skilled in the art will recognize that other circuits, such as half-bridge circuits, full-bridge circuits, and the like may be employed. Assume for this example that transistors Q1-Q6 are power silicon carbide (SiC) MOSFETs that each have drain (D), gate (GX), source (S), and source-Kelvin (KX) terminals. For the embodiments described below, transistors Q1-Q6 are vertical, N channel MOSFETs, wherein the drain contact is on the bottom of the device and the source, gate, and source-Kelvin contacts are on the top of the device.

Each high side transistor Q1, Q3, Q5 is coupled in series with a corresponding low side transistor Q2, Q4, Q6. The drains D of the high side transistors Q1, Q3, Q5 are coupled to a V+ terminal, and the sources S of the low side transistors Q2, Q4, Q6 are coupled to the V− terminal. For the first leg of the three-phase circuit, the source S of high side transistor Q1 is coupled to the drain D of the low side transistor Q2 to provide a first output, which is referenced as terminal U. For the second leg of the three-phase circuit, the source S of high side transistor Q3 is coupled to the drain D of the low side transistor Q4 to provide a second output, which is referenced as terminal V. For the third leg of the three-phase circuit, the source S of high side transistor Q5 is coupled to the drain D of the low side transistor Q6 to provide a third output, which is referenced as terminal W. Each of the transistors Q1-Q6 also have independent gate terminals G1-G6 (GX generally) and source-Kelvin signal terminals K1-K6 (KX generally).

Diodes D1-D6 may be coupled between the drains and sources for the respective transistors Q1-Q6. In each instance, the anodes of the diodes D1-D6 are coupled to the sources of the respective transistors Q1-Q6, and the cathodes of the diodes D1-D6 would be coupled to the drains of the transistors Q1-Q6. The diodes D1-D6 may be separate devices or integrated into the packages of the transistors Q1-Q6.

Figure 1A:
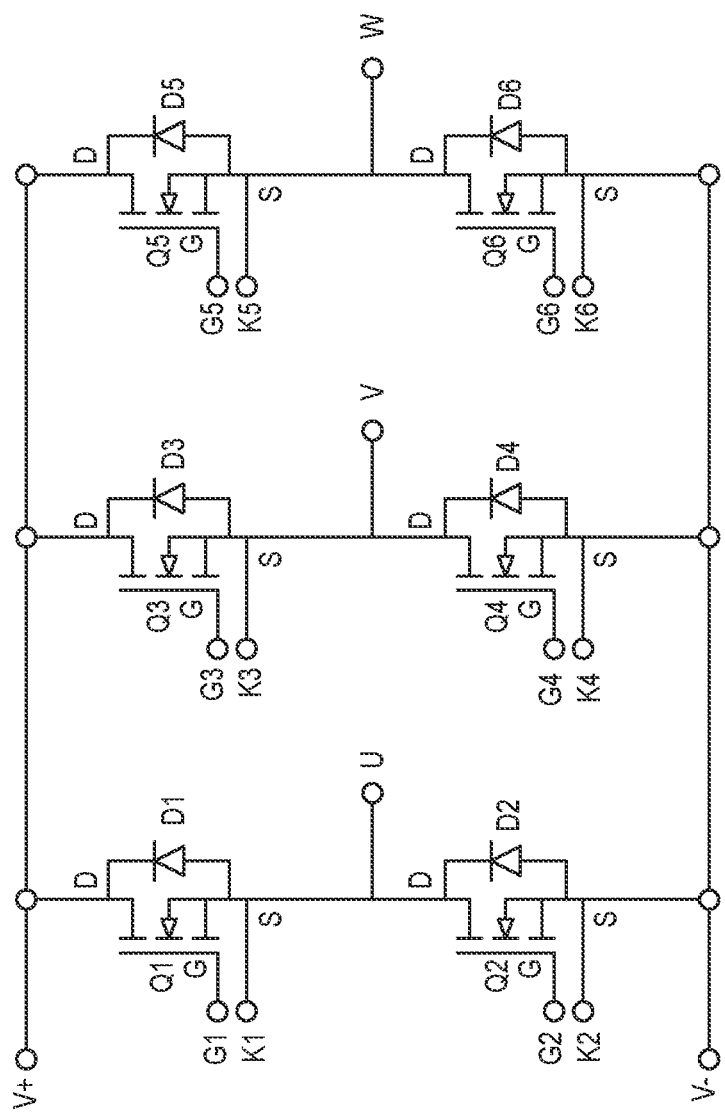
FIG. 1A illustrates a schematic of a three-phase circuit.

As illustrated in FIG. 1B, additional circuitry, such as a temperature circuit 16 for sensing internal device temperatures, may be provided in association with the three-phase circuit and can be as simple as a thermistor, negative temperature coefficient (NTC) device, or resistance temperature detector (RTD) with terminals TEMP1 and TEMP2. In such embodiments, the resistance of the thermistor or RTD will change with temperature and be measurable across terminals TEMP1 and TEMP2. The thermistor will generally have a negative temperature coefficient in that the resistance has a negative correlation to temperature, while the RTD will generally have a positive temperature coefficient in that the resistance has a positive correlation to temperature. Additional circuits, such as current sensing, may be introduced using functional elements and dedicated pins.

Figure 3:
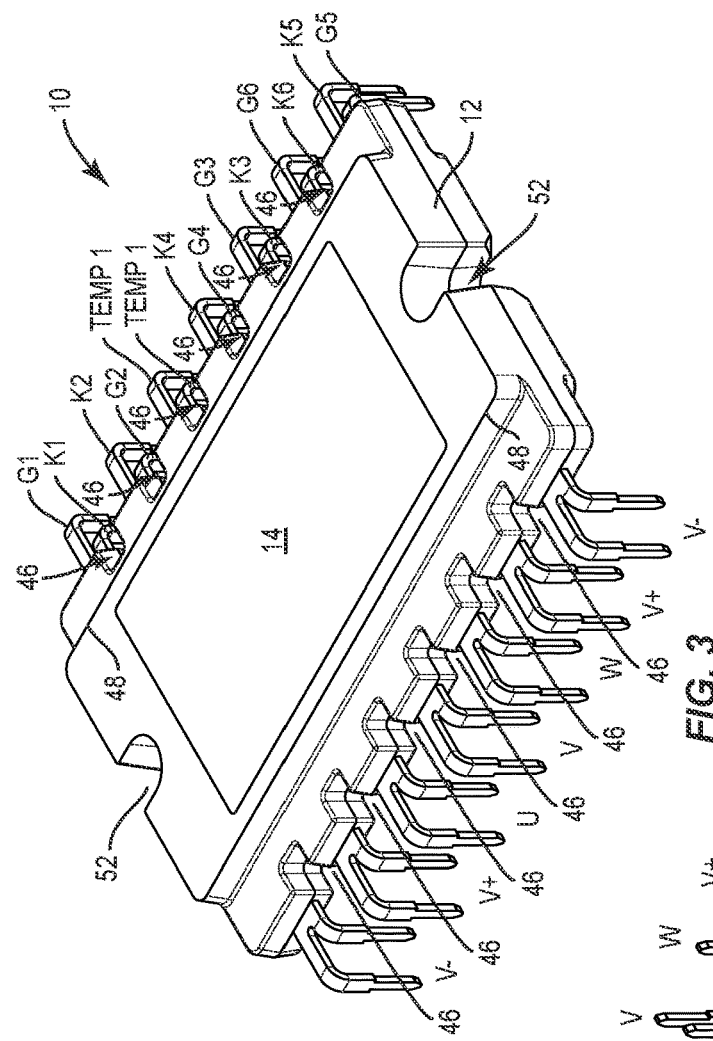
FIG. 3 is an isometric view of a bottom side of the power module according to the first embodiment of the disclosure.
Figure 2:
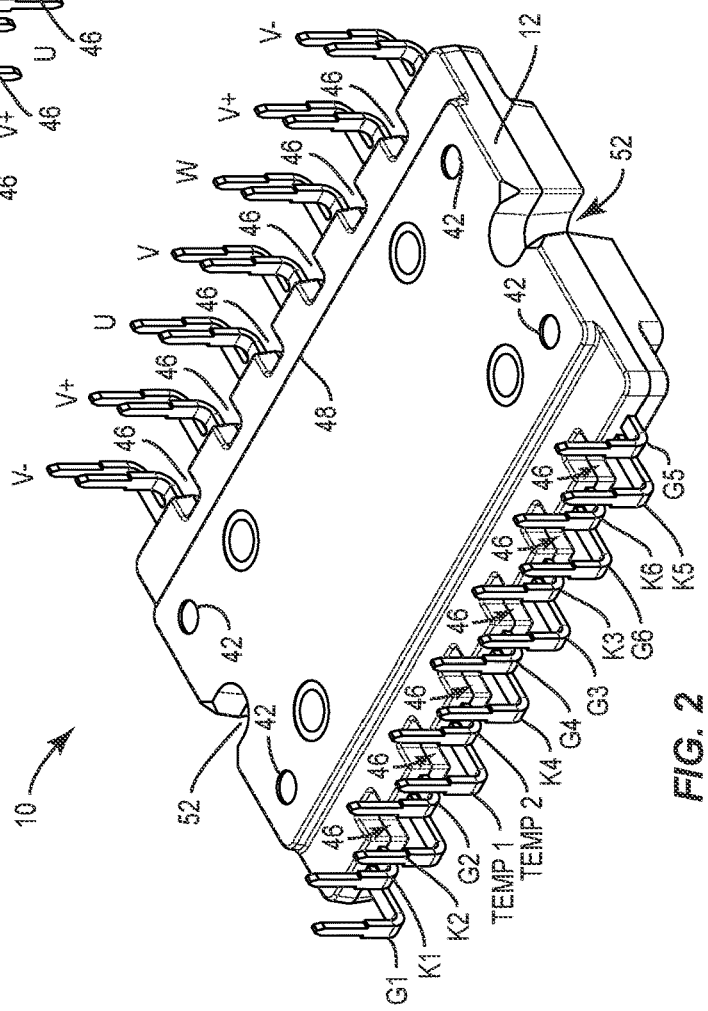
FIG. 2 is an isometric view of a top side of a power module according to a first embodiment of the disclosure.

FIGS. 2-8 are various isometric and plan views of a power module 10 that provides the electronics necessary to implement various power circuits, such as the three-phase circuit and temperature circuit 16 of FIGS. 1A and 1B, according to the first embodiment. FIGS. 2 and 3 are top and bottom isometric views. FIG. 4 is a top plan view. FIGS. 5, 6, and 7 are opposing side and end views, respectively. FIG. 8 is a bottom plan view. The power module 10 has a housing 12 that may include a thermal pad 14, which is visible in FIGS. 3 and 5-8. While the housing 12 may be molded as described below, other types of housings, such as those with one or more fabricated or preformed components, are also envisioned. The thermal pad 14 is electrically isolated from any of the internal circuitry and facilitates the transfer of heat from the power module 10 to ambient, a heat sink structure, or the like, which is not depicted. Other referenced features in these figures are described further below after a description of the internal architecture of the power module 10.

Figure 9:
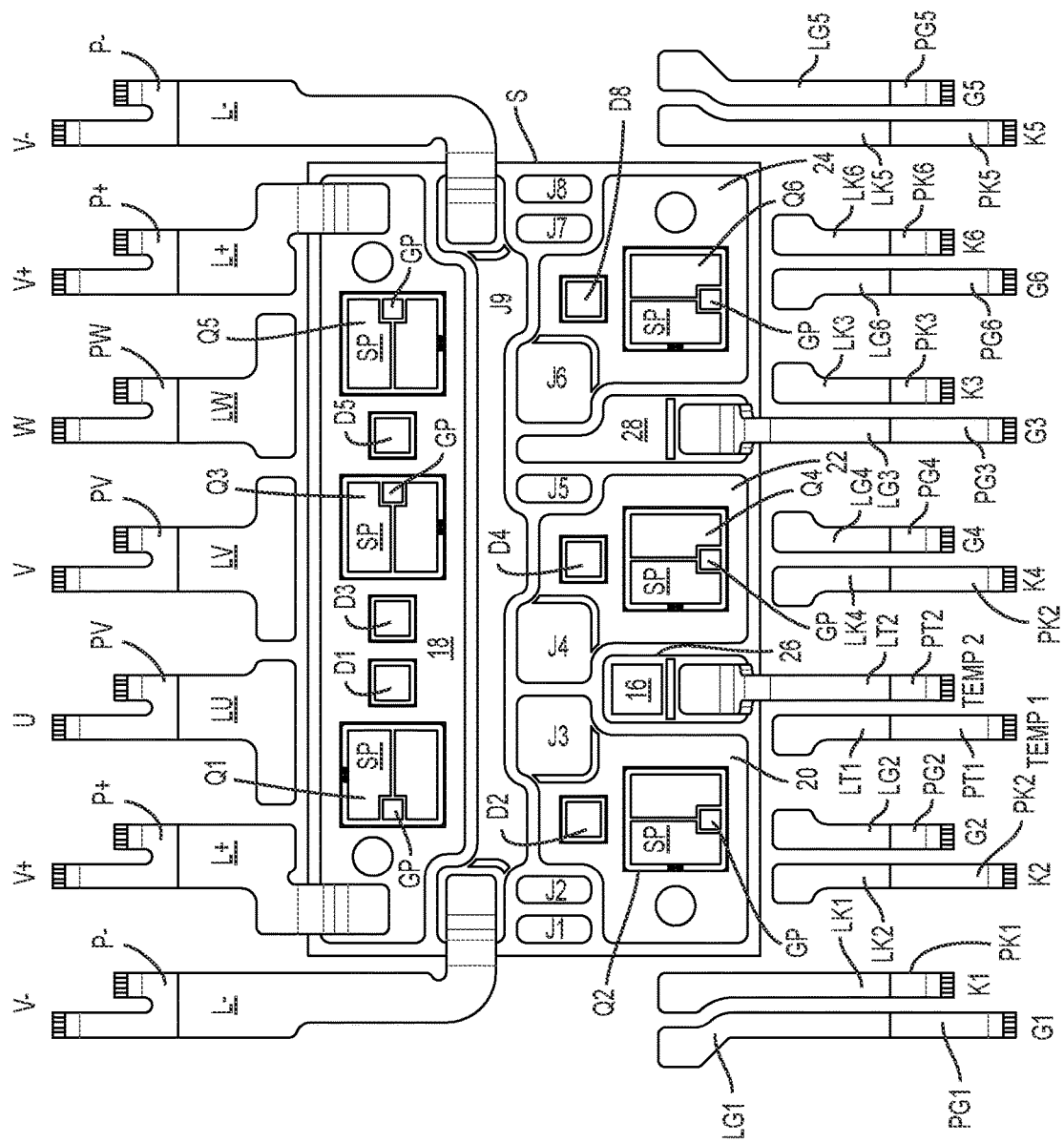
Figure 12:
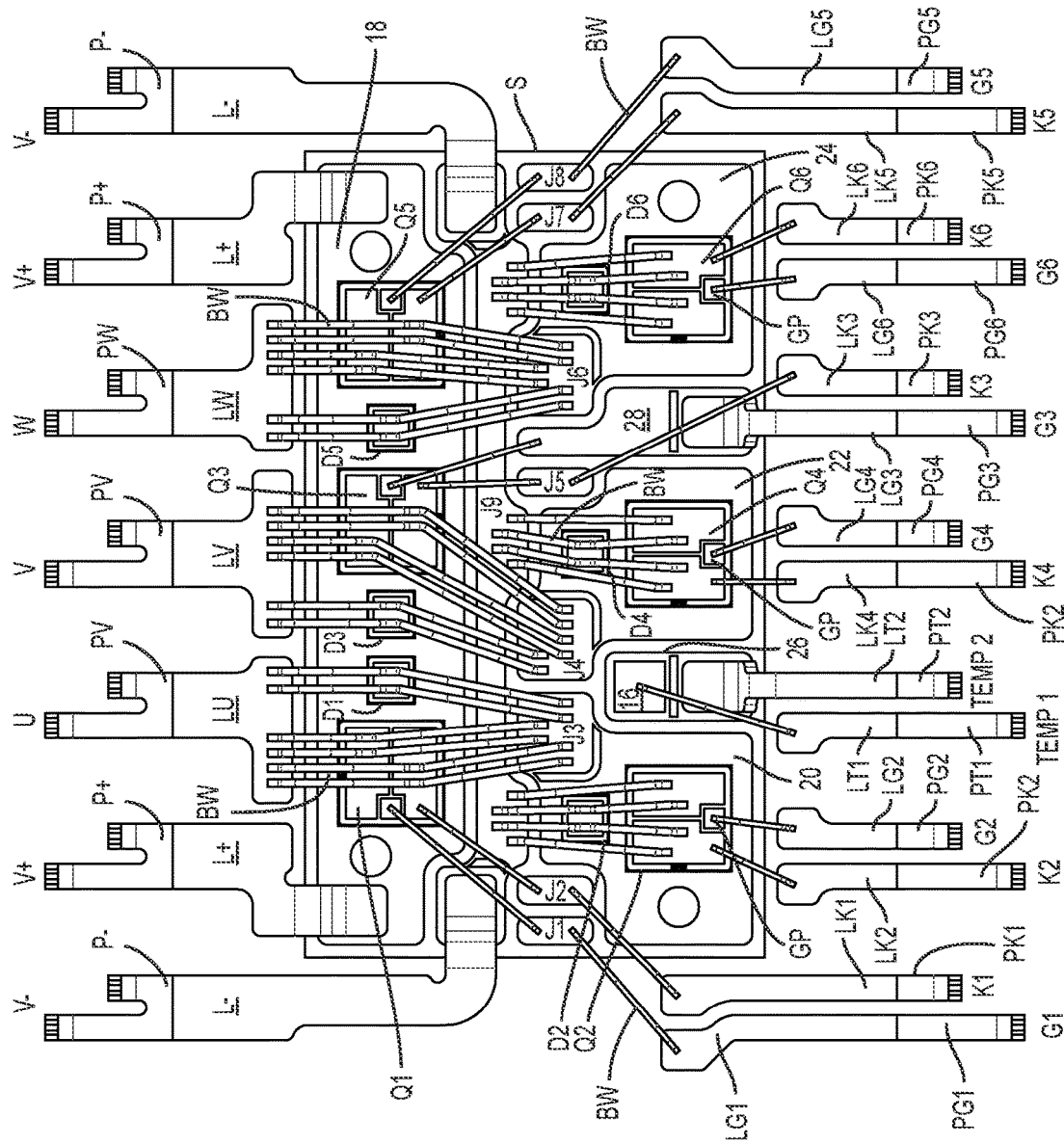

FIGS. 9-11 illustrate various isometric and plan views of the internal architecture of the power module 10, wherein the housing 12 and bond wires BW (or like interconnects) are removed to more clearly illustrate the various components of the internal architecture. FIGS. 12-14 illustrate various isometric and plan views of the internal architecture of the power module 10 with the bond wires BW in place for an embodiment for the three-phase circuit. The following description is directed initially to FIGS. 9-11 where the bond wires BW are not shown, and then transitions to FIGS. 12-14 when the connected afforded by the bond wires BW are discussed. The bond wires BW are generically labeled, but care is taken to clearly describe the connections provided by all of the illustrated bond wires BW. FIGS. 17 and 18 are plan and isometric views of the top side of the power module 10 with the housing 12 removed.

With reference to FIGS. 9-11, at the heart of the internal architecture is a substrate S upon which numerous conductive device pads 18, 20, 22, 24, 26, 28 are formed on one side. The thermal pad 14 is formed on the opposite side, as best illustrated in FIG. 11. The device pads 18-28 and the thermal pad 14 may be formed from any conductive material, such as copper or the like. For the three-phase circuit of FIG. 1A, the high-side transistors Q1, Q3, Q5 are mounted on the elongated device pad 18, which extends along the side adjacent power terminals V−, V+, U, V, W. Low-side transistor Q2 resides on the device pad 20. Low-side transistor Q6 resides on the device pad 24. Low-side transistor Q4 resides on the device pad 22. The temperature circuit 16 resides on device pad 26, which is formed on the substrate, and in this embodiment, between device pads 20 and 22. Each of the device pads 18-26 is electrically isolated from the others.

In one embodiment, the drains D of the various transistors Q1-Q6 are directly attached to the respective device pads 18-24 to form both a mechanical and electrical connection of the transistors Q1-Q6 to the device pads 18-24. The temperature circuit 16 may be mechanically and electrically connected to device pad 26 in similar fashion.

The various terminals can be segregated into power terminals and signal terminals. As noted above, the power terminals include power terminals V+, V−, U, V, and W. The signal terminals include signal terminals G1-G6, K1-K6, TEMP1, TEMP2. While each of these terminals may take any shape necessary to work with the intended applications, those shown are geared toward being soldered, press-fitted, or snapped into corresponding holes into a printed circuit board (not shown). As illustrated, the direct current (DC) input power terminals V− and V+ and the alternating current (AC) output power terminals U, V, W extend out of the first side of the power module 10. Signal terminals G1-G6, K1-K6, TEMP1, TEMP2 extend out of a second side of the power module 10, wherein the first side of the power module 10 is opposite the second side of the power module 10.

There are two power terminals V− at opposing ends of the first side of the power module 10. Each of the power terminals V− extends to opposite ends of an elongated jumper pad J9. The power terminals V− each have a pair of power pins P− and a leg L− that extends from the power pins P− to jumper pad J9. In this embodiment, power terminals V− are directly mechanically attached to the substrate via jumper pad J9. Most, if not all, of the legs L− of the power terminals V− reside with the housing 12 wherein power pins P− extend outside of the housing 12 and turn approximately 90 degrees toward the top side of the power module 10.

The power terminals V+ are between the power terminals V− along the first side of the power module 10, wherein each of the power terminals V+ is adjacent a corresponding one of the power terminals V−. The power terminals V+ extend to opposing ends of device pad 18 such that transistors Q1, Q3, Q5 and diodes D1, D3, and D5 reside on the device pad 18 between the power terminals V+. The power terminals V+ each have a pair of power pins P+ and a leg L+ that extends from the power pins P+ to the device pad 18. Most, if not all, of the legs L+ of the power terminals V+ reside with the housing 12 wherein power pins P+ extend outside of the housing 12 and turn approximately 90 degrees toward the top side of the power module 10. In this embodiment, power terminals V+ are directly mechanically attached to the substrate via device pad 18.

Each of the power terminals U, V, W are between the power terminals V+ along the first side of the power module 10. Each of the power terminals U, V, W have a pair of power pins PU, PV, PW and a leg LU, LV, LW, respectively. The legs LU, LV, LW do not directly contact any pads on the substrate S. Instead, groups of bond wires BW are used to facilitate electrical connections.

Reference is now directed to FIGS. 12-14 where bond wires BW are included. For power terminal U, a first group of bond wires BW extends from leg LU of power terminal U to the source pad SP on top of transistor Q1 and over to jumper pad J3, which is an extension of and electrically connected to device pad 20. A second group of bond wires BW extends from leg LU to the anode on the top of diode D1 and over to jumper pad J3. As such, the first and second groups of bond wires BW connect the source of transistor Q1 to the drain of transistor Q2, the anode of diode D1, and the power terminal U.

For power terminal V, a second group of bond wires BW extends from leg LV of power terminal V to the source pad SP on top of transistor Q3 and over to jumper pad J4, which is an extension of and electrically connected to device pad 22. A second group of bond wires BW extends from leg LV to the anode on the top of diode D3 and over to jumper pad J4. As such, the first and second groups of bond wires BW connect the source of transistor Q3 to the drain of transistor Q4, the anode of diode D3, and the power terminal V.

For power terminal W, a third group of bond wires BW extends from leg LW of power terminal W to the source pad SP on top of transistor Q5 and over to jumper pad J6, which is an extension of and electrically connected to device pad 24. A second group of bond wires BW extends from leg LW to the anode on the top of diode D5 and over to jumper pad J6. As such, the first and second groups of bond wires BW connect the source of transistor Q5 to the drain of transistor Q6, the anode of diode D3, and the power terminal W.

Signal terminal G1 is electrically coupled to the gate pad GP of transistor Q1 through a first bond wire BW that extends from signal terminal G1 to jumper pad J1 and a second bond wire BW that extends from jumper pad J1 to the gate pad GP of transistor Q1. The first bond wire BW is coupled to the leg LG1 of the signal terminal G1 at a point opposite that of the signal pin PG1.

Signal terminal K1 is electrically coupled to the source pad SP of transistor Q1 through a first bond wire BW that extends from signal terminal K1 to jumper pad J2 and a second bond wire BW that extends from jumper pad J2 to the source pad SP of transistor Q1. The first bond wire BW is coupled to the leg LK1 of the signal terminal K1 at a point opposite that of the signal pin PK1.

Signal terminal K2 is coupled to a source pad SP of transistor Q2 via a first bond wire BW. Additional bond wires BW are used to couple the source pad SP of transistor Q2 to jumper pad J9, which is coupled to the V− terminals. In this embodiment, these additional bond wires BW may have an intermediate connection to the anode of diode D2, which sits on device pad 20, such that the cathode is electrically coupled to the device pad 20. The first bond wire BW is coupled to the leg LK2 of the signal terminal K2 at a point opposite that of the signal pin PK2. Signal terminal G2 is coupled to the gate pad GP of transistor Q2 via a second bond wire BW. The second bond wire BW is coupled to the leg LG2 of the signal terminal G2 at a point opposite that of the signal pin PG2.

As illustrated, the temperature circuit 16 may be a vertically oriented semiconductor that is mounted onto and makes electrical contact with device pad 26. Signal terminal TEMP1 is coupled to a top contact of the temperature circuit 16 with a first bond wire BW. The first bond wire BW is coupled to the leg LT1 of the signal terminal TEMP1 at a point opposite that of the signal pin PT1. Signal terminal TEMP2 extends to and is directly coupled to the device pad 26 without use of a bond wire BW. As such, signal terminal TEMP2 is directly mechanically attached to the substrate via device pad 26.

Signal terminal G3 extends to and is directly coupled to device pad 26 without use of a bond wire BW. As such, signal terminal G3 is directly mechanically attached to the substrate via device pad 28. A bond wire is used to couple device pad 28 to the gate pad GP of transistor Q3. Signal terminal K3 is electrically coupled to the source pad SP of transistor Q3 through a first bond wire BW that extends from signal terminal K3 to jumper pad J5 and a second bond wire BW that extends from jumper pad J5 to the source pad SP of transistor Q3. The first bond wire BW is coupled to the leg LK3 of the signal terminal K3 at a point opposite that of the signal pin PK3.

Signal terminal K4 is coupled to a source pad SP of transistor Q4 via a first bond wire BW. Additional bond wires BW are used to couple the source pad SP of transistor Q4 to jumper pad J9, which is coupled to the V− terminals. In this embodiment, these additional bond wires may have an intermediate connection to the anode of diode D4, which sits on device pad 22, such that cathode is electrically coupled to the device pad 22. The first bond wire BW is coupled to the leg LK4 of the signal terminal K4 at a point opposite that of the signal pin PK4. Signal terminal G4 is coupled to the gate pad GP of transistor Q4 via a second bond wire BW. The second bond wire BW is coupled to the leg LG4 of the signal terminal G4 at a point opposite that of the signal pin PG4.

Signal terminal G5 is electrically coupled to the gate pad GP of transistor Q5 through a first bond wire BW that extends from signal terminal G5 to jumper pad J8 and a second bond wire BW that extends from jumper pad J8 to the gate pad GW of transistor Q5. The first bond wire BW is coupled to the leg LG5 of the signal terminal G5 at a point opposite that of the signal pin PG5.

Signal terminal K5 is electrically coupled to the source pad SP of transistor Q5 through a first bond wire BW that extends from signal terminal K5 to jumper pad J7 and a second bond wire BW that extends from jumper pad J7 to the source pad SP of transistor Q5. The first bond wire BW is coupled to the leg LK5 of the signal terminal K5 at a point opposite that of the signal pin PK5.

Signal terminal K6 is coupled to a source pad SP of transistor Q6 via a first bond wire BW. Additional bond wires BW are used to couple the source pad SP of transistor Q6 to jumper pad J9, which is directly coupled to the V− terminals. In this embodiment, these additional bond wires may have an intermediate connection to the anode of diode D6, which sits on device pad 24, such that cathode is electrically coupled to the device pad 24. The first bond wire BW is coupled to the leg LK6 of the signal terminal K6 at a point opposite that of the signal pin PK6. Signal terminal G6 is coupled to the gate pad GP of transistor Q6 via a first bond wire BW. The first bond wire BW is coupled to the leg LG6 of the signal terminal G6 at a point opposite that of the signal pin PG6.

In the illustrated embodiments, the pins P−, P+, U, V, W of the respective power terminals V−, V+, U, V, W each have dual pin heads that are staggered with respect to one another. For higher power devices, additional power terminals may be employed for the power terminals V−, V+, U, V, W. A first pin head for each power terminal V−, V+, U, V, W is linearly aligned with the first pin heads of the other power terminals V−, V+, U, V, W, and a second pin head for each terminal is linearly aligned with the second pin heads of the other power terminals V−, V+, U, V, W.

Unlike the power terminals V−, V+, U, V, W, the signal terminals G1-G6, K1-K6, TEMP1, TEMP2 each terminate with a single pin head in the illustrated embodiments. Adjacent pairs of the signal terminals are configured such that the pin heads for these signal terminals are staggered. As illustrated, pin heads for signal terminals G1, K2, TEMP1, K4, G3, G6, K5 are linearly aligned with one another while signal terminals K1, G2, TEMP2, G4, K3, K6, G5 are linearly aligned with one another yet staggered apart from signal terminals G1, K2, TEMP1, K4, G3, G6, K5. Staggered is defined to mean falling in at least two different planes that are parallel to the sides of the housing 12 from which the various terminals extend. In alternative embodiments, the pin heads may all be aligned or staggered in a different manner that that illustrated.

Figure 16:
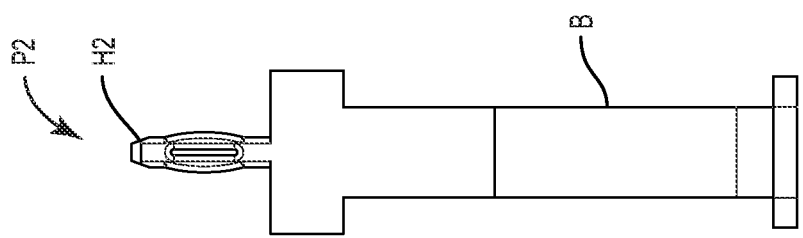
FIGS. 15 and 16 illustrate terminal pins according to two embodiments of the disclosure.
Figure 15:
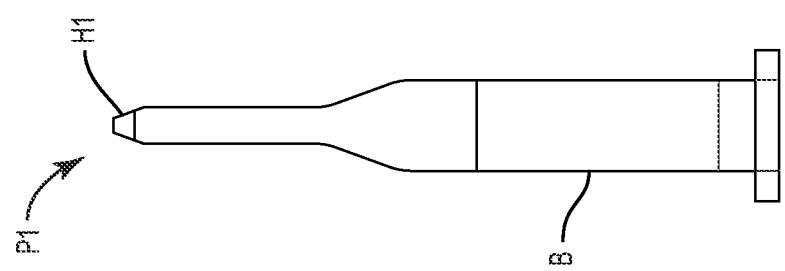

FIGS. 15 and 16 show two exemplary pin configurations for any of the various pins (P+, P−, PU, PV, PW, PG1-PG6, PK1-PK6) described above. The pin P1 of FIG. 15 has a linear body B that narrows into a linear head H1, which is configured to be inserted into a corresponding aperture of a printed circuit board or the like, and soldered to facilitate a mechanical and electrical connection between the printed circuit board and the head H1. Pin P2 of FIG. 16 has a press-fit head H2 at the end of the linear body B. The press-fit head H2 is designed to compress radially when inserted into the corresponding aperture of the printed circuit board to provide a solderless mechanical and electrical connection between the printed circuit board and the head H1. Once inserted, the press-fit head will apply outward, radial pressure to secure the press-fit head H2 in the corresponding aperture. Multiple press-fit head styles could be used, depending on the thickness of the metal and insertion process. The pins P1 will generally have a bend of approximately 90 degrees (i.e. 80-100 degrees) as shown in FIGS. 9-14. The bend is not illustrated in FIGS. 15 and 16 to better illustrate the linear body and configuration of the heads H1, H2.

As illustrated in FIGS. 17 and 18, the lower surface of the substrate S includes the large thermal pad 14, which covers a large majority of the substrate S and is intended to be directly attached to a heat sink, cold plate, or similar heat removal apparatus. Such attachment would be formed with either bolting with thermal interface material, metal sintering (silver, copper, or other metal), soldering, conductive adhesive, welding, or other thermally conductive attachment. Other embodiments of the design could be attached in a similar manner to an interstitial base plate, which could then be bolted or welded to the cold plate.

Figure 19:
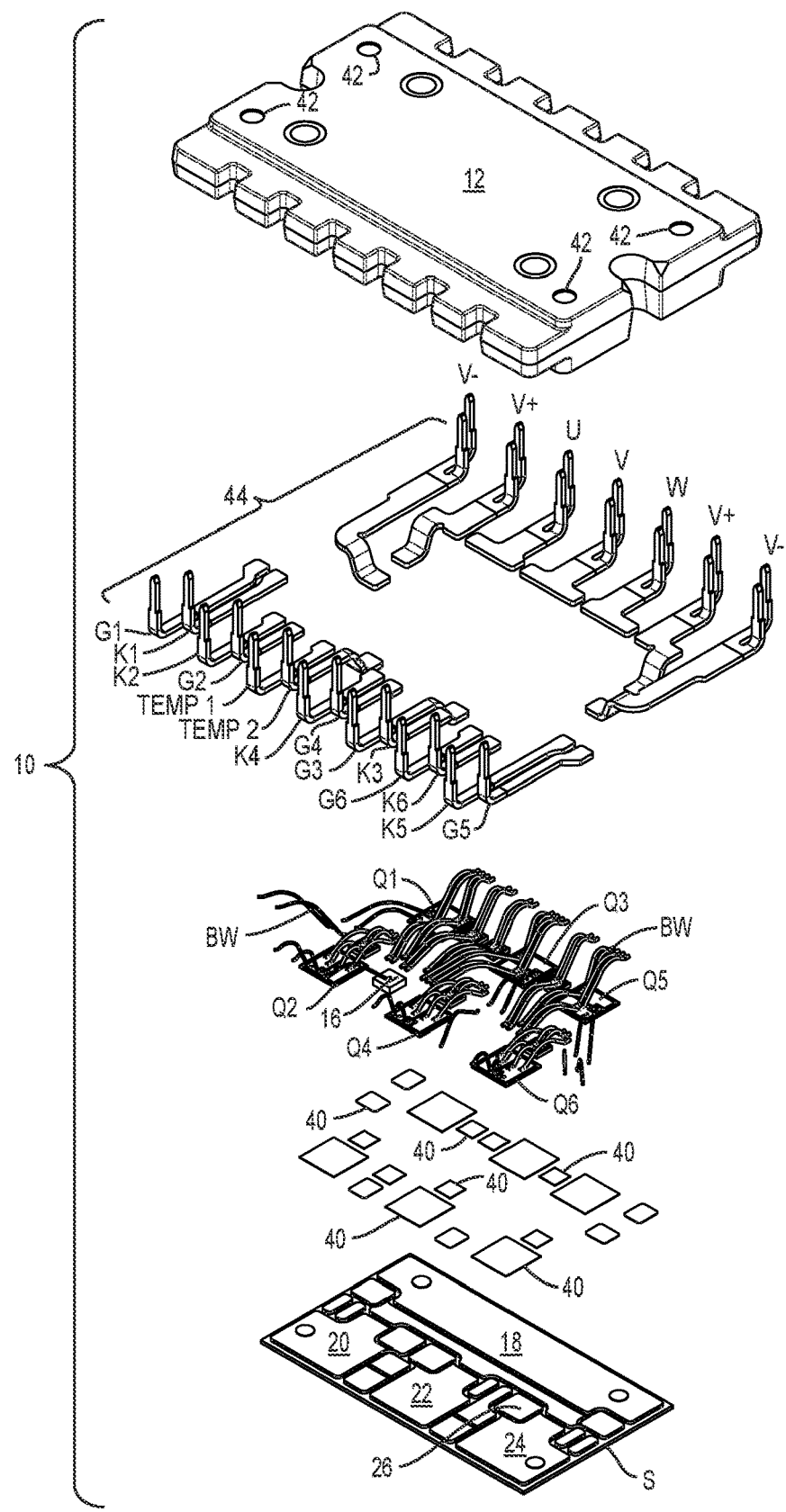
FIG. 19 is an exploded view of the first embodiment of the present disclosure.

Reference is now made to the exploded view of the power module 10 in FIG. 19. Starting from the bottom of the figure, the drain pads of transistors Q1-Q6 and the temperature circuit 16 are electrically and mechanically attached to the device pads 18-26 on the substrate S using device attach material 40. The device attach material 40 may be solder, adhesive, sintered metal, a laser weld, an ultrasonic weld, and the like that provides mechanical structure, high current interconnection, and high thermal conductivity. The power terminals V+, V−, U, V, W, signal terminals G1-G6, K1-K6, and temperature circuit signal terminals TEMP1, TEMP2 may be formed from a single lead frame 44. As detailed above, bond wires BW are used to make the various component and terminal connections necessary to implement the three-phase and temperature circuits of FIGS. 1A and 1B. The lead frame 44 is typically a metal contact strip for high current external connection and internal interconnection. Any contacts are joined together on a single sheet, often with multiple products per sheet, and processed as an array before being formed and singulated. The bond wires BW may be ultrasonically or thermosonically bonded large diameter wire, capable of supporting relatively high current electrical interconnection.

The housing 12 may be formed using a transfer or an injection molding process to provide mechanical structure, high voltage isolation. The housing 12 encapsulates the internal parts of the power module 10. The mold compound used for the housing 12 may be a transfer or compression molded epoxy molding compound (EMC) capable of providing mechanical structure, high voltage isolation, coefficient of thermal expansion (CTE) matching, and low humidity absorption.

As illustrated in FIGS. 3 and 8, the thermal pad 14 on the backside of the power module 10 is exposed without coverage of the housing material. During fabrication, an epoxy resin used for the housing 12 may seep in and leave a small amount of flashing on the thermal pad 14. To ensure the mold compound or other encapsulant does not cover the outside surface of the thermal pad 14, hold down pins may be used to apply pressure on the edges or other surfaces of the substrate S to enhance the seal to the mold tooling. These pins retract as the material cures and may leave a vestige 42 in the compound. Ejector pins are used to release the product from the mold tooling and will also leave small vestiges. The number and location of the hold down and ejector pins will vary based on the design embodiment, as more or fewer of these elements may be required as the width of the module varies.

Clearance and creepage are important aspects for a high voltage product. Between conductors at different voltage potentials, clearance is the shortest direct path in air between them. Creepage is the shortest direct path along a surface between them. Meeting safety standards is a challenge and is often at odds with manufacturing (tooling, epoxy flow, etc.) and product size (footprint and power density). For small transfer molded packages, particularly low profile and high voltage SiC based products, reaching a suitable balance between module size and voltage safety is necessary.

For creepage, notches 46 and/or ridges 48 may be formed in the housing 12 to increase the surface distance between the various voltage nodes provided by the various signal and power terminals, as illustrated in FIGS. 2, 3 4, and 8. Creepage between the signal terminals G1-G6, K1-K6, the power terminals V+, V−, U, V, W, and/or the thermal pad 14 may be addressed in a first fashion by adding elongated ledges 48 and ridges on the surface of the compound or placing elongated trenches between the voltage nodes. Specific features will depend on the size and voltage class of a given embodiment of the design.

As illustrated in FIG. 8, the notches 46 may be placed between each set of adjacent signal terminals G1/K1 through G6/K6 and on either side of the pair of TEMP1/TEMP2 signal terminals. Further notches 46 may be placed between adjacent ones of the power terminals V1−, V+, U, V, W. Also illustrated are mounting notches 52 on the opposing non-terminal sides of the housing. These mounting notches 52 allow the power module 10 to be securely attached to a PCB or other structure using bolts, screws, or other fasteners. The mounting notches 52 may also act as creepage extenders. In the illustrated embodiments, the transistors Q1-Q6 are placed in a row on the respective device pads 18, 20, 22, 24 based on switch position. The overall layout, length, width, aspect ratio, and number of transistors for each switch position may be parametrically varied to scale up or down to the desired output power for the power module 10. Transistors Q1-Q6 and any other devices may be attached with either (1) metal sintering (silver, copper, or other metal), (2) soldering, (3) conductive adhesive, or (4) other electrically and thermally conductive attachment. A temperature sensor, which is represented by temperature circuit 16, may be included and placed either on an isolated device pad 26 as shown or directly next to one of the transistors Q1-Q6, depending on the sensor technology or nature of the temperature circuit 16. The temperature sensor illustrated is generally attached in a similar manner to the transistors Q1-Q6. Depending on attachment method, the substrate metal used for the device pads 18-26 may be fully or partially plated with silver, nickel, nickel/gold, or similar depending on material compatibility.

Fiducials may be added to aid in automated pick and place of the transistors Q1-Q6 and/or any other included components, as well as for subsequent process steps requiring a determination of relative location. Fiducials may be provided by partial plating, etched features or edges, laser marked symbols, or other visually distinctive feature that can be recognized by a machine vision system.

In general, there are two categories of electrical loops in a power module: the power loop and the signal loop. The power loop is a high voltage, high current path between power terminals V+, V− and through the transistors Q1-Q6 for delivering power to a load via the drain (or collector) and source (or emitter) of the transistors Q1-Q6, wherein the load is connected to terminals U, V, W for a three-phase circuit. The signal loop is a low voltage, low current path through the gates G1-G6 (or bases) and the sources (or emitters) of transistors Q1-Q6. The gate-source (or base-emitter) signal path actuates the transistors Q1-Q6 to effectively turn-on or turn-off the transistors Q1-Q6. The signal loop may also entail the source-Kelvin connections K1-K6 of the transistors Q1-Q6.

Figure 20:
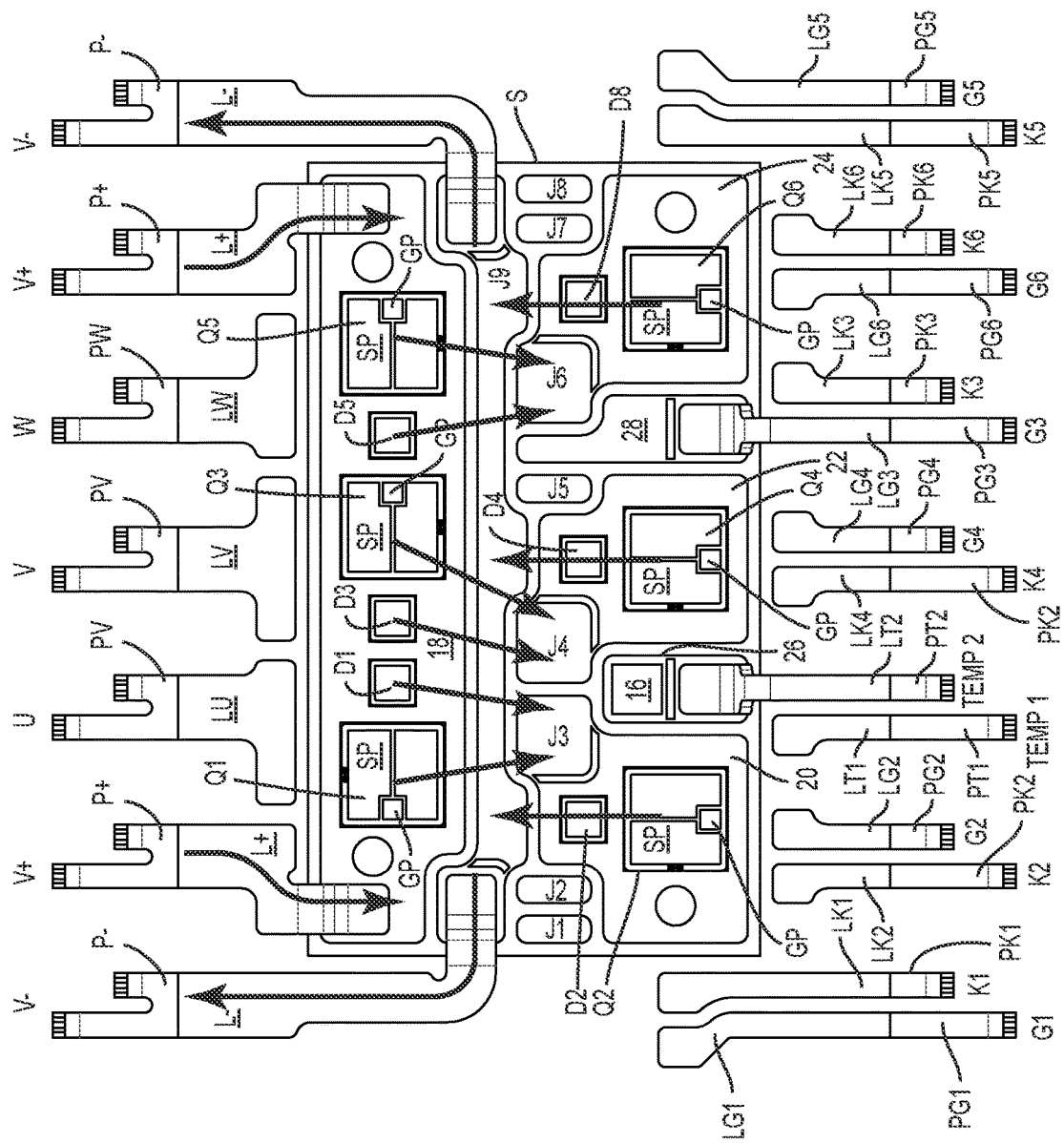
FIG. 20 illustrates an exemplary power loop for the first embodiment of the disclosure.

The power loop effectively runs between power terminals V+, V−. Power terminals V+, V− are typically connected across a DC supply, such as a battery, in parallel with a large capacitance. An exemplary power loop for the illustrated power module 10 is shown in FIG. 20. FIG. 20 illustrates an exemplary power commutation loop for the three-phase embodiments described above. The internal and external layout allows the power to enter and leave the power module 10 efficiently and with effective magnetic flux cancellation. Power flows in through (1) power terminal V+, (2) down to device pad 18 of substrate S, (3) over to the drains D of high-side transistors Q1, Q3, Q5, (4) up through the high-side transistors Q1, Q3, Q5 to the respective source pads SP, (5) over to the respective device pads 20, 22, 24 of substrate S via bond wires BW and jumper pads J3, J4, J6, (6) over to the drains D of the respective low-side transistors Q2, Q4, Q6, (7) up through the low-side transistors Q2, Q4, Q6 to the respective source pads SP, (8) over to jumper pad J9 via bond wires BW, and (9) directly to power terminals V−. For the various outputs, power terminals U, V, W are respectively coupled using daisy chained bond wires BW to the source pads SP of the high-side transistors Q1, Q3, Q5. The loops are well balanced for each paralleled device. The low profile of the power module 10, compact module size, flux cancellation, and balanced loops result in extremely low loop inductance and clean, efficient switching.

The signal loops for each transistor position preferably provide a low impedance to minimize voltage stresses on the device gates during switching. While these can be buffered or reduced by adding resistors, this is often at the cost of increased complexity, higher cost, and slower switching speeds. To enhance switching performance, the power loops and signal loops can be substantially, if not completely, independent of each other to enable low switching loss with fast, well controlled dynamics.

In certain embodiments, any drain-source (or collector-emitter) and gate-source (or gate-emitter) loops share the same connection at the source (or emitter) of the various transistors Q1-Q6. If the power path couples into the signal paths, extra dynamics are introduced through either positive or negative feedback. Typically, negative feedback introduces extra losses as the power path coupling fights the control signal. In essence, the power path coupling tries to turn the transistors off when the control signal is trying to turn the transistors on. Positive feedback typically causes instability as the power path coupling amplifies the control signal until the transistors are destroyed. Ultimately, any significant coupling of power and signal paths results in a reduction in switching quality, slower switching speeds, increased losses, and possible destruction.

Accordingly, one way to improve switching quality is to ensure independent power and control loops. The power source connection has a separate path from the signal source (referred to as a source Kelvin) such that one does not overlap or interfere with the other. The closer the separate connections are made to the transistors Q1-Q6, the better the switching performance.

Figure 21:
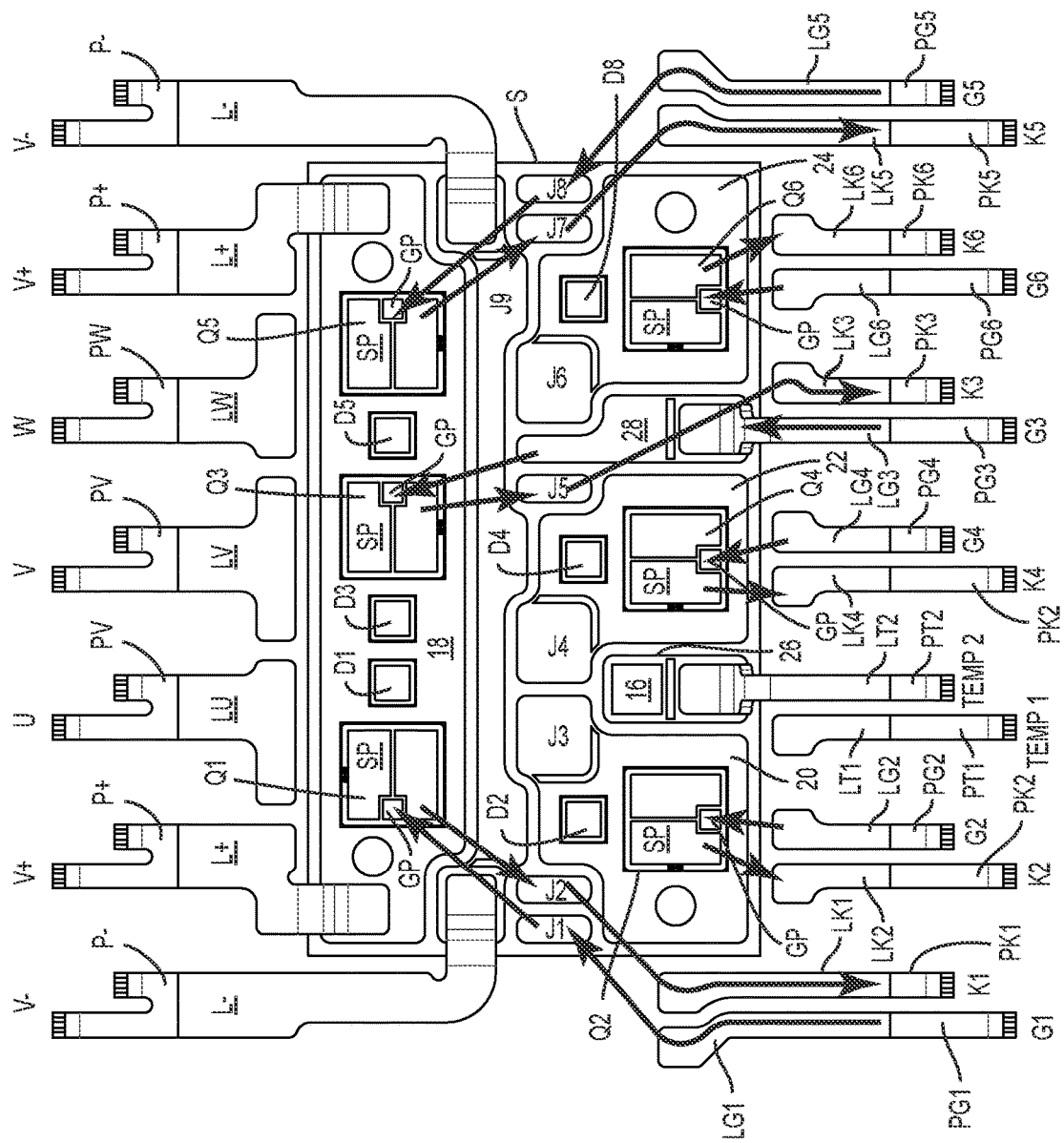
FIG. 21 illustrates an exemplary signal loop according to the first embodiment of the present disclosure.

FIG. 21 illustrates the internal signal loops for the high-side and low-side positions. Here, the gate signals take one of two general paths. The first is a direct path, which is used for signal loops associated with signal terminals G2, G4, G6 wherein a single bond wire is used to connect the respective signal terminals G2, G4, G6 to the gate pads GP of transistors Q2, Q4, Q6. The second path employs a jumper and multiple bond wire jumps. Signal terminal G1 is connected to gate pad GP via jumper pad J1 using two bond wires. Signal terminal G5 is connected to gate pad GP via jumper pad J8 using two bond wires. Signal terminal G3 is a little different in that it connects directly to device pad 26 and a bond wire BW connects the device pad 26 to the gate pad GP of transistor Q3.

The returning source-Kelvin signals take similar paths. The first is a direct path, which is used for signal loops associated with signal terminals K2, K4, K6 wherein a single bond wire is used to connect the respective signal terminals K2, K4, K6 to the source pads SP of transistors Q2, Q4, Q6. The second path employs a jumper and multiple bond wire jumps. Signal terminal K1 is connected to gate pad GP via jumper pad J1 using two bond wires. Signal terminal K3 is connected to source pad SP via jumper pad J5 using two bond wires. Signal terminal K5 is connected to source pad SP via jumper pad J7 using two bond wires.

In the illustrated embodiment, a true source-Kelvin implementation is provided in which the power and signal loops are completely independent. In some embodiments, transistor devices may be paralleled to increase output current. When paralleling, a further issue arises in transconductance mismatches between the transistor devices. Transconductance is effectively the current gain of the device—the relationship between the output current to the input voltage. During switching, the input voltage rises and results in an associated rise in the output current. If there is a transconductance difference between paralleled transistor devices (which is common in silicon carbide, SiC, power devices), they will each have slightly different turn on characteristics. With different currents running through each device, they will have slightly different voltages across themselves. This voltage mismatch will result in a 'balancing current' that flows between the devices during switching.

This balancing current will prefer the path of least impedance, which could be through the signal loop instead of the power loop. If balancing current flows through the signal loop, it can affect switching quality. Introducing this high, uncontrolled current through the signal loop can also present a reliability concern as the signal loops are not intended to carry high currents. For these paralleled devices, a jumper bond wire BW may be connected between their source pads SP to create a very low impedance pathway for these balancing currents.

Figure 23:
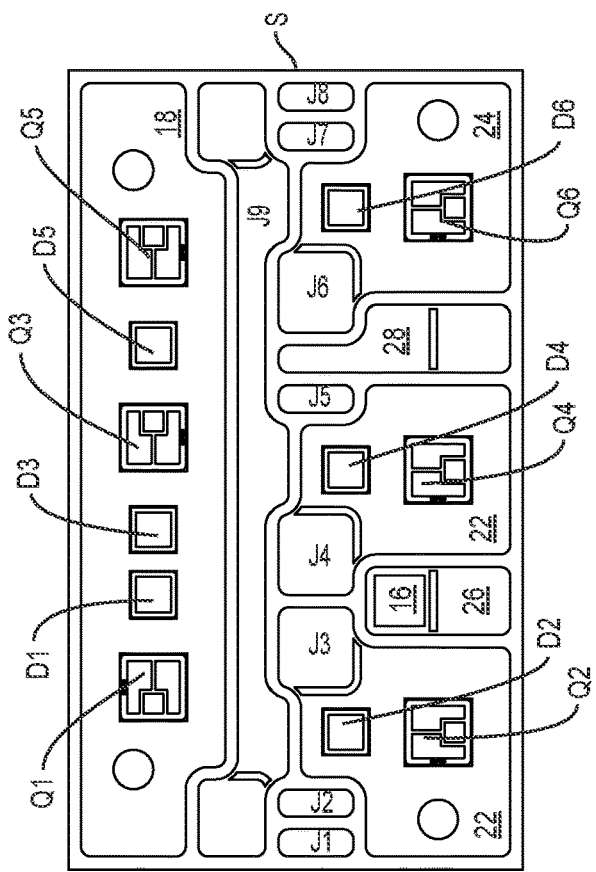
FIG. 23 illustrates an exemplary embodiment of the power module when used with smaller power devices.
Figure 22:
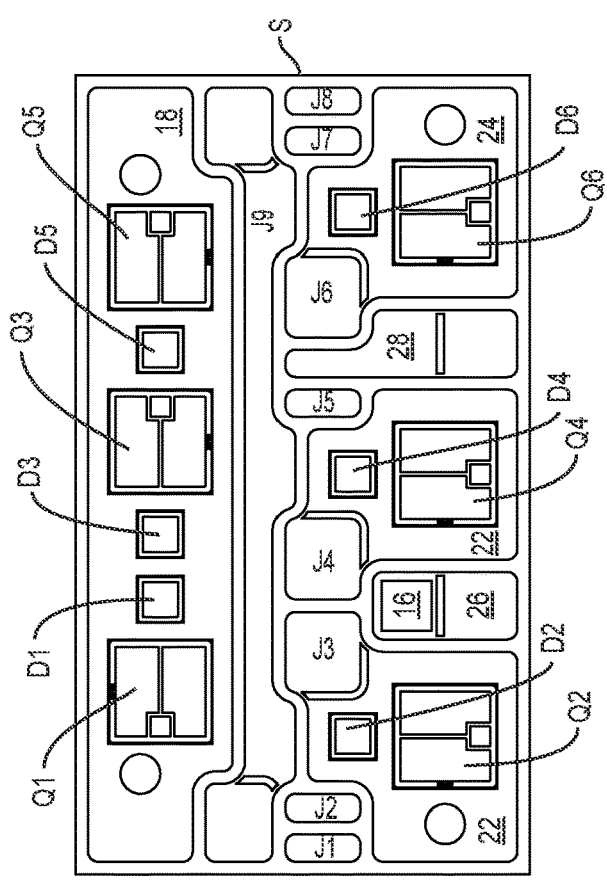
FIG. 22 illustrates an exemplary embodiment of the power module when used with larger power devices.

Modularity is a beneficial feature of the concepts described herein. Within a given footprint, transistors Q1-Q6 and/or other devices of different sizes can be incorporated, as illustrated in FIGS. 22 and 23. For a given footprint, the transistors Q1-Q6 of FIG. 22 are much larger and have higher power than the smaller and lower power transistors Q1-Q6 of FIG. 23. Such flexibility allows the designer to optimize device sizes and operating parameters for a given system and operational conditions. Since the size of the devices often correlates the overall expense of the power module 10, using appropriately sized devices is key to keeping costs down.

Figure 25:
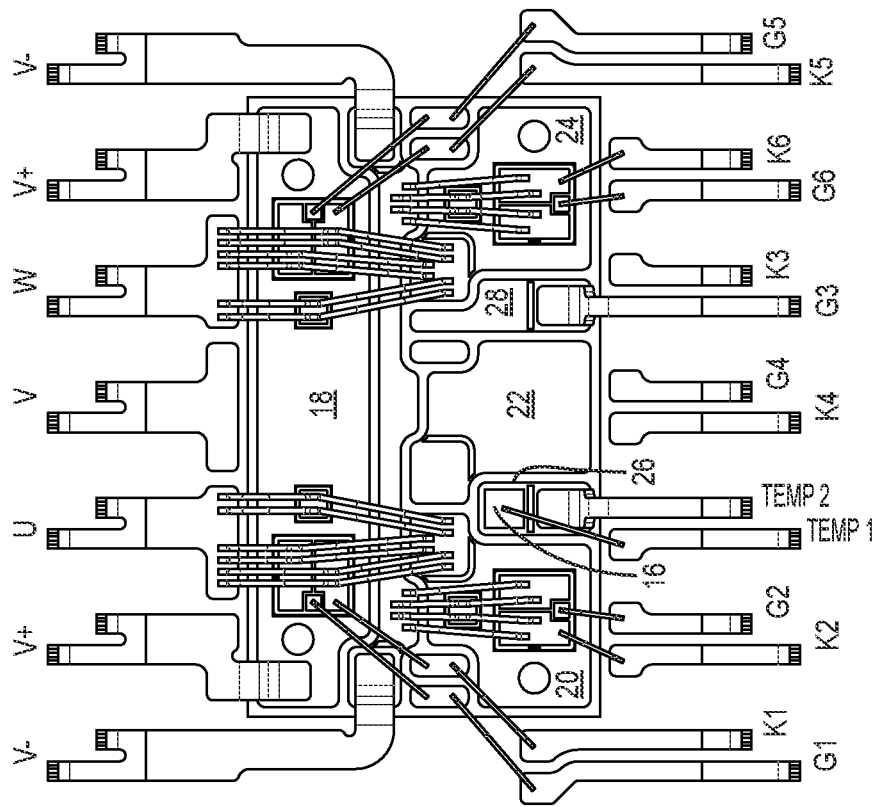
FIG. 25 illustrates an exemplary embodiment of the power module where certain available locations for power devices are not used.
Figure 24:
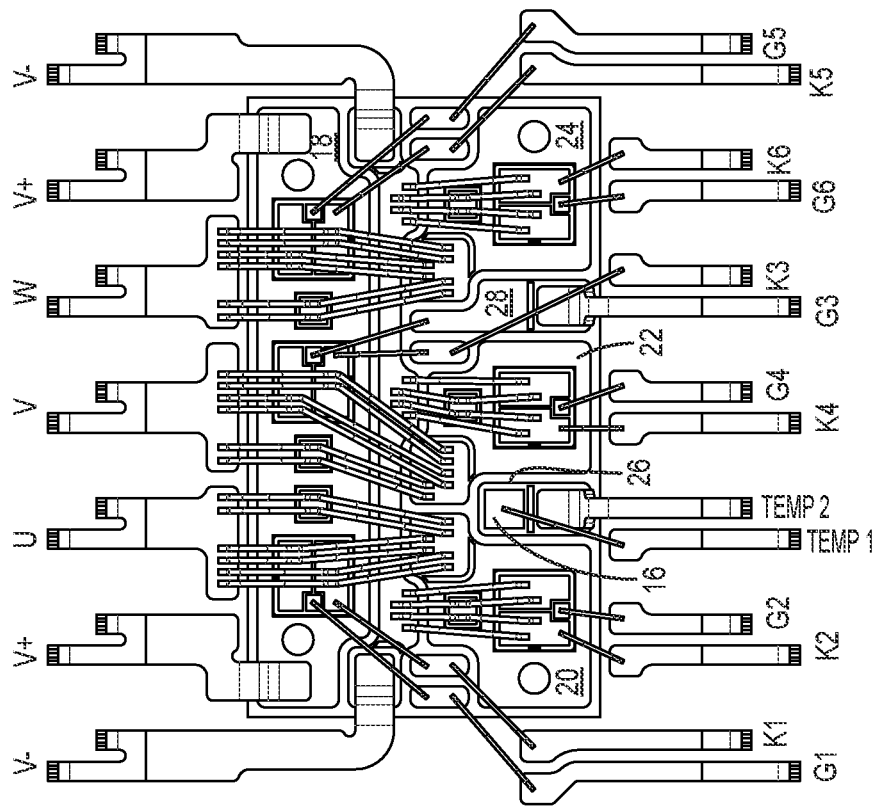
FIG. 24 illustrates an exemplary embodiment of the power module for use with parallel power devices.

In some embodiments, the substrate S may be widened to accommodate multiple, paralleled devices to increase power handling capabilities. FIGS. 24 and 25 illustrate the option to either fully populate, wherein all possible sites are filled (FIG. 24), or down populate (FIG. 25), wherein select possible sites are left unfilled. This is a useful technique to adjust device area for a given application, having an additional benefit of not having to develop or manufacture a new custom device. More embodiments and combinations are envisioned with different device rotations, depending on bond pad layouts, different device sizes, and larger or smaller numbers of paralleled devices.

In addition to being highly modular, the layout for the power module 10 is readily scalable to be as compact as possible for the required device size and count. Parametric scalability gives the product designer many variables to adjust to streamline thermal performance and product size for desired electrical performance parameters.

As the power module 10 scales up or down, the internal layout also scales with it. As the current will vary based on total device area, wider electrical paths dynamically scale to properly carry current without excessive resistive losses. Scaling the electrical paths helps ensure the effective current paths to each device are practically equalized. In some situations, as the size scales, the width of the power terminals and number of power wire bonds may be scaled up or down as needed or desired.

The concepts disclosed herein provide an optimized three-phase package design for the next generation of power modules 10. A modular layout is possible where multiple device areas can be fully or partially populated in the same structure. The scalable layout supports multiple optimized products by simply increasing or decreasing the length and width to achieve the desired power device area and/or size. The layout may be optimized for high currents by grouping the power and signal terminals. The inline edges may be used for the power terminal area instead of relying on voltage isolation.

The architecture provides a logical flow of power with minimal or reduced power loop inductance, which results in clean, efficient switching. The architecture provides a low inductance structure with minimal voltage overshoot to facilitate higher bus voltages and higher voltage operation. The layout also supports paralleling two or more power devices per switch position, while providing nearly identical power loop inductance for each power device.

The signal and power terminals may be arranged and organized by use, with the DC input connections on one side, the AC output connections on the other, and signal contacts grouped by electrical potential. A dual DC input terminal arrangement allows for even power distribution and low inductance connection to external bussing. The internal layout may be configured to minimize bond wire distance, with direct bonding from terminals to device pads.

The concepts herein also provide the option to form electrical connections from power terminals to power substrate through wire bond or by direct soldering. Staggered power and signal terminals may provide voltage isolation clearances between the various signal and power terminals. The in-line power and signal terminals allow regularly spaced pin pitches for headers, PCBs, etc.

The architecture provides a true Kelvin implementation for the signal loops, resulting in clean, efficient switching. An integrated temperature sensor or the like may be placed close to the power devices. The temperature sensor or like circuitry may be placed on an isolated substrate trace (for non-isolated vertical sensors) or placed on the same trace as a device (for lateral isolated sensors). There is an option for an overcurrent/desaturation signal pin to detect overcurrent events.

The architecture may reduce costs through minimizing the number of unique parts used; minimizing the area of the power substrate; maximizing the utilization of the semiconductor area; and volume processing using lead frames, transfer molding, and production automation.

The power module 10 may have molded-in voltage creepage extenders on the top and bottom sides of the package. The power module 10 may also have power terminals configurable for solder attachment, connection to a header, clipped to or soldered to a wire, laser welding, or integrated with press-fit contacts for solderless connection. The signal terminals are configurable for solder attachment, connection to a header, clipped to or soldered to a wire, laser welding, or integrated with press-fit contacts for solderless connection. The exposed thermal pad on the backside of the power module 10 is configurable for permanent silver sintering, copper sintering, or soldering directly to a cold plate or heat sink. Edge notches of the mold compound for the housing 14 may act as bolt holes, allowing for non-permanent bolting directly to a cold plate or heat sink using a thermal interface material, thermal gap pad, phase change material, or similar.

The concepts provided above, address one, some, or all of the above to provide a unique and novel power module 10. Those skilled in the art will recognize improvements and modifications to the present disclosure. All such improvements and modifications are considered within the scope of the concepts disclosed herein.

What is claimed is:

1. A power module comprising:
   a substrate comprising a bottom side and a top side comprising a plurality of device pads;
   a plurality of power devices mounted on the plurality of device pads and arranged to provide a power circuit having a first input, a second input, and at least one output;
   at least one first input power terminal providing the first input for the power circuit;
   at least one second input power terminal providing the second input for the power circuit;
   at least one output power terminal providing the at least one output for the power circuit; and
   a housing for the substrate, the plurality of power devices, and portions of the at least one first input power terminal, the at least one second input power terminal, and the at least one output power terminal, wherein the at least one first input power terminal, the at least one second input power terminal, and the at least one output power terminal extend out of a first side of the housing;
   a plurality of signal terminals that provide a plurality of control signals for the power circuit, wherein portions of the plurality of signal terminals extend out of a second side of the housing that is opposite the first side of the housing.

2. The power module of claim 1 wherein the at least one first input power terminal comprises a first V-terminal and a second V-terminal extending out of the first side of the housing and the at least one second input power terminal comprises a first V+ terminal and a second V+ terminal extending out of the first side of the housing.

3. The power module of claim 2 wherein the first V+ terminal and the second V+ terminal are between the first V-terminal and the second V-terminal.

4. The power module of claim 3 wherein the at least one output power terminal is between the first V+ terminal and the second V+ terminal.

5. The power module of claim 4 wherein the at least one output power terminal comprises a first output power terminal providing a first output of the power circuit, a second output power terminal providing a second output of the power circuit, and a third output power terminal providing a third output of the power circuit.

6. The power module of claim 4 further comprising a plurality of signal terminals that provide a plurality of control signals for the power circuit, wherein portions of the plurality of signal terminals extend out of a second side of the housing that is opposite the first side of the housing.

7. The power module of claim 6 wherein the plurality of signal terminals comprises a first plurality of gate signal terminals that provide gate control signals to gates of a first set of the plurality of power devices and a second plurality of gate signal terminals that provide gate control signals to gates of a second set of the plurality of power devices.

8. The power module of claim 7 wherein the plurality of signal terminals further comprises a first plurality of source-Kelvin signal terminals that provide source-Kelvin control signals to sources of the first set of the plurality of power devices and a second plurality of source-Kelvin signal terminals that provide source-Kelvin control signals to sources of the second set of the plurality of power devices.

9. The power module of claim 8 wherein each gate signal terminal of the first plurality of gate signal terminals is adjacent a corresponding source-Kelvin signal terminal of the first plurality of source-Kelvin signal terminals, and each gate signal terminal of the second plurality of gate signal terminals is adjacent a corresponding source-Kelvin signal terminal of the second plurality of source-Kelvin signal terminals.

10. The power module of claim 9 wherein pin heads for adjacent pairs of the first and second plurality of gate signal terminals and the first and second source-Kelvin signal terminals are staggered apart from one another.

11. The power module of claim 10 wherein each of the at least one first input power terminal, the at least one second input power terminal, and the at least one output power terminal has a first pin head and a second pin head that is staggered apart from the first pin head.

12. The power module of claim 6 wherein:
   the substrate comprises at least one jumper pad, a first bond wire, and a second bond wire; and
   the first bond wire extends from at least one of the plurality of signal terminals to the at least one jumper pad, and the second bond wire extends from the at least one jumper pad to the power circuit.

13. The power module of claim 1 wherein the at least one first input power terminal or the at least one second input power terminal is directly mechanically coupled to the substrate.

14. The power module of claim 1 wherein the at least one first input power terminal and the at least one second input power terminal are directly mechanically coupled to the substrate.

15. The power module of claim 14 wherein the at least one output power terminal is not directly mechanically coupled to the substrate, and bond wires couple the at least one output power terminal to the power circuit.

16. The power module of claim 15 wherein at least one of a plurality of signal terminals is directly mechanically coupled to the substrate, and at least one other of the plurality of signal terminals is coupled to the power circuit with a bond wire.

17. The power module of claim 1 wherein at least one of the plurality of signal terminals is directly mechanically coupled to the substrate, and at least one other of the plurality of signal terminals is coupled to the power circuit with a bond wire.

18. The power module of claim 1 further comprising a thermal pad on a bottom side of the substrate, wherein the thermal pad is exposed through the housing.

19. The power module of claim 1 wherein the power circuit is a three-phase circuit.

20. The power module of claim 1 wherein notches are recessed into one or more sides of the housing for attaching the power module to another apparatus.

21. The power module of claim 1 wherein each of the at least one first input power terminal, the at least one second input power terminal, and the at least one output power terminal is terminated with at least one linear pin configured for solder attachment to another apparatus.

22. The power module of claim 1 wherein creepage extenders are provided on at least one of the top side and the bottom side of the housing.

23. The power module of claim 1 wherein at least one notch is provided in the first side of the housing between adjacent ones of the at least one first input power terminal, the at least one second input power terminal, or the at least one output power terminal.

24. The power module of claim 1 wherein a temperature circuit is provided on the substrate.

25. The power module of claim 1 wherein each of the at least one first input power terminal, the at least one second input power terminal, and the at least one output power terminal has a first pin head and a second pin head that is staggered apart from the first pin head.

26. A power module comprising:
a substrate comprising a bottom side and a top side having a plurality of device pads;
a plurality of power devices mounted on the plurality of device pads and arranged to provide a power circuit having a first input, a second input, and at least one output;
at least one first input power terminal providing the first input for the power circuit;
at least one second input power terminal providing the second input for the power circuit;
at least one output power terminal providing the at least one output for the power circuit; and
a housing for the substrate, the plurality of power devices, and portions of the at least one first input power terminal, the at least one second input power terminal, and the at least one output power terminal, wherein the at least one first input power terminal or the at least one second input power terminal is directly mechanically coupled to the substrate.

27. The power module of claim 26 wherein the at least one first input power terminal and the at least one second input power terminal are directly mechanically coupled to the substrate.

28. The power module of claim 27 wherein the at least one output power terminal is not directly mechanically coupled to the substrate and bond wires couple the at least one output power terminal to the power circuit.

29. The power module of claim 28 wherein at least one of a plurality of signal terminals is directly mechanically coupled to the substrate, and at least one other of the plurality of signal terminals is coupled to the power circuit with a bond wire.

30. The power module of claim 26 further comprising a plurality of signal terminals that provide a plurality of control signals for the power circuit, wherein the at least one first input power terminal, the at least one second input power terminal, and the at least one output power terminal extend out of a first side of the housing and portions of the plurality of signal terminals extend out of a second side of the housing that is opposite the first side of the housing.

31. The power module of claim 30 wherein at least one of the plurality of signal terminals is directly mechanically coupled to the substrate and at least one other of the plurality of signal terminals is coupled to the power circuit with a bond wire.

32. A power module comprising:
a substrate comprising a bottom side and a top side having a plurality of device pads;
a plurality of power devices mounted on the plurality of device pads and arranged to provide a power circuit having a first input, a second input, and at least one output;
at least one first input power terminal providing the first input for the power circuit;
at least one second input power terminal providing the second input for the power circuit;
at least one output power terminal providing the at least one output for the power circuit; and
a housing for the substrate, the plurality of power devices, and portions of the at least one first input power terminal, the at least one second input power terminal, and the at least one output power terminal, wherein each of the at least one first input power terminal, the at least one second input power terminal, and the at least one output power terminal has a first pin head and a second pin head that is staggered apart from the first pin head.

33. A power module comprising:
a substrate comprising a bottom side and a top side comprising a plurality of device pads;
a plurality of power devices mounted on the plurality of device pads and arranged to provide a power circuit having a first input, a second input, and at least one output;
at least one first input power terminal providing the first input for the power circuit;
at least one second input power terminal providing the second input for the power circuit;
at least one output power terminal providing the at least one output for the power circuit; and
a housing for the substrate, the plurality of power devices, and portions of the at least one first input power terminal, the at least one second input power terminal, and the at least one output power terminal, wherein the at least one first input power terminal, the at least one second input power terminal, and the at least one output power terminal extend out of a first side of the housing;
wherein the at least one first input power terminal comprises a first V-terminal and a second V-terminal extending out of the first side of the housing and the at least one second input power terminal comprises a first V+ terminal and a second V+ terminal extending out of the first side of the housing.

34. A power module comprising:
a substrate comprising a bottom side and a top side comprising a plurality of device pads;
a plurality of power devices mounted on the plurality of device pads and arranged to provide a power circuit having a first input, a second input, and at least one output;
at least one first input power terminal providing the first input for the power circuit;

at least one second input power terminal providing the second input for the power circuit;

at least one output power terminal providing the at least one output for the power circuit; and a housing for the substrate, the plurality of power devices, and portions of the at least one first input power terminal, the at least one second input power terminal, and the at least one output power terminal, wherein the at least one first input power terminal, the at least one second input power terminal, and the at least one output power terminal extend out of a first side of the housing;

wherein the at least one first input power terminal or the at least one second input power terminal is directly mechanically coupled to the substrate.

35. A power module comprising:

a substrate comprising a bottom side and a top side comprising a plurality of device pads;

a plurality of power devices mounted on the plurality of device pads and arranged to provide a power circuit having a first input, a second input, and at least one output;

at least one first input power terminal providing the first input for the power circuit;

at least one second input power terminal providing the second input for the power circuit;

at least one output power terminal providing the at least one output for the power circuit; and a housing for the substrate, the plurality of power devices, and portions of the at least one first input power terminal, the at least one second input power terminal, and the at least one output power terminal, wherein the at least one first input power terminal, the at least one second input power terminal, and the at least one output power terminal extend out of a first side of the housing;

wherein each of the at least one first input power terminal, the at least one second input power terminal, and the at least one output power terminal is terminated with at least one linear pin configured for solder attachment to another apparatus.

36. A power module comprising:

a substrate comprising a bottom side and a top side comprising a plurality of device pads;

a plurality of power devices mounted on the plurality of device pads and arranged to provide a power circuit having a first input, a second input, and at least one output;

at least one first input power terminal providing the first input for the power circuit;

at least one second input power terminal providing the second input for the power circuit;

at least one output power terminal providing the at least one output for the power circuit; and a housing for the substrate, the plurality of power devices, and portions of the at least one first input power terminal, the at least one second input power terminal, and the at least one output power terminal, wherein the at least one first input power terminal, the at least one second input power terminal, and the at least one output power terminal extend out of a first side of the housing;

wherein creepage extenders are provided on at least one of the top side and the bottom side of the housing.

37. A power module comprising:

a substrate comprising a bottom side and a top side comprising a plurality of device pads;

a plurality of power devices mounted on the plurality of device pads and arranged to provide a power circuit having a first input, a second input, and at least one output;

at least one first input power terminal providing the first input for the power circuit;

at least one second input power terminal providing the second input for the power circuit;

at least one output power terminal providing the at least one output for the power circuit; and a housing for the substrate, the plurality of power devices, and portions of the at least one first input power terminal, the at least one second input power terminal, and the at least one output power terminal, wherein the at least one first input power terminal, the at least one second input power terminal, and the at least one output power terminal extend out of a first side of the housing;

wherein each of the at least one first input power terminal, the at least one second input power terminal, and the at least one output power terminal has a first pin head and a second pin head that is staggered apart from the first pin head.

* * * * *